United States Patent
Wierer, Jr. et al.

(10) Patent No.: US 8,163,575 B2
(45) Date of Patent: Apr. 24, 2012

(54) GROWN PHOTONIC CRYSTALS IN SEMICONDUCTOR LIGHT EMITTING DEVICES

(75) Inventors: Jonathan J. Wierer, Jr., Fremont, CA (US); Michael R. Krames, Mountain View, CA (US); Nathan F. Gardner, Sunnyvale, CA (US)

(73) Assignee: Philips Lumileds Lighting Company LLC, San Jose, CA (US)

( * ) Notice: Subject to any disclaimer, the term of this patent is extended or adjusted under 35 U.S.C. 154(b) by 784 days.

(21) Appl. No.: 11/156,105

(22) Filed: Jun. 17, 2005

(65) Prior Publication Data

US 2006/0284187 A1   Dec. 21, 2006

(51) Int. Cl.
*H01L 21/00* (2006.01)

(52) U.S. Cl. ............... 438/22; 438/44; 257/79; 257/94; 257/E23.001; 257/E23.006

(58) Field of Classification Search ........... 257/E33.006, 257/79, 94, 98, 99, E33.001; 438/22, 44
See application file for complete search history.

(56) References Cited

U.S. PATENT DOCUMENTS

| | | | |
|---|---|---|---|
| 5,371,025 A | 12/1994 | Sung | |
| 5,779,924 A | 7/1998 | Krames et al. | |
| 5,955,749 A | 9/1999 | Joannopoulos et al. | |
| 6,071,795 A | 6/2000 | Cheung et al. | |
| 6,091,085 A | 7/2000 | Lester | |
| 6,156,581 A | 12/2000 | Vaudo et al. | |
| 6,307,218 B1 | 10/2001 | Steigerwald et al. | |
| 6,335,548 B1 | 1/2002 | Roberts et al. | |
| 6,363,096 B1 | 3/2002 | Dodabalapur et al. | |
| 6,534,798 B1 | 3/2003 | Scherer et al. | |
| 6,559,075 B1 | 5/2003 | Kelly et al. | |
| 6,770,353 B1 | 8/2004 | Mardilovich et al. | |
| 6,831,302 B2 | 12/2004 | Erchak et al. | |
| 7,009,216 B2 * | 3/2006 | Otsuka et al. | 257/98 |
| 7,078,735 B2 * | 7/2006 | Shono et al. | 257/98 |
| 7,291,864 B2 * | 11/2007 | Weisbuch et al. | 257/98 |
| 7,521,854 B2 * | 4/2009 | Erchak | 313/498 |
| 2002/0004307 A1 | 1/2002 | Yamada | |
| 2002/0130311 A1 | 9/2002 | Lieber et al. | |
| 2003/0016895 A1 | 1/2003 | Holm et al. | |
| 2003/0089899 A1 | 5/2003 | Lieber et al. | |

(Continued)

FOREIGN PATENT DOCUMENTS

EP    0 874 405 A2    10/1998

(Continued)

OTHER PUBLICATIONS

Kipshidze et al., "Controlled growth of GaN nanowires by pulsed metalorganic chemical vapor deposition", Applied Physics Letters, vol. 86, 033104, 2005, pp. 1-3.*

(Continued)

*Primary Examiner* — Khiem D Nguyen

(57) ABSTRACT

A photonic crystal is grown within a semiconductor structure, such as a III-nitride structure, which includes a light emitting region disposed between an n-type region and a p-type region. The photonic crystal may be multiple regions of semiconductor material separated by a material having a different refractive index than the semiconductor material. For example, the photonic crystal may be posts of semiconductor material grown in the structure and separated by air gaps or regions of masking material. Growing the photonic crystal, rather than etching a photonic crystal into an already-grown semiconductor layer, avoids damage caused by etching which may reduce efficiency, and provides uninterrupted, planar surfaces on which to form electric contacts.

35 Claims, 3 Drawing Sheets

U.S. PATENT DOCUMENTS

| | | | |
|---|---|---|---|
| 2003/0141507 A1* | 7/2003 | Krames et al. | 257/79 |
| 2003/0222263 A1 | 12/2003 | Choi | |
| 2003/0235229 A1 | 12/2003 | Deng et al. | |
| 2004/0016936 A1 | 1/2004 | Tanaka et al. | |
| 2004/0091010 A1 | 5/2004 | Choquette | |
| 2004/0109644 A1 | 6/2004 | Assefa et al. | |
| 2004/0113550 A1* | 6/2004 | Adachi et al. | 313/512 |
| 2004/0135155 A1 | 7/2004 | Otsuka et al. | |
| 2004/0207320 A1 | 10/2004 | Erchak | |
| 2004/0207323 A1 | 10/2004 | Erchak et al. | |
| 2004/0213307 A1 | 10/2004 | Lieber et al. | |
| 2004/0240834 A1 | 12/2004 | Katoh | |
| 2005/0011431 A1 | 1/2005 | Samuelson et al. | |
| 2005/0035354 A1 | 2/2005 | Lin et al. | |
| 2005/0040419 A1 | 2/2005 | Erchak et al. | |
| 2005/0040424 A1 | 2/2005 | Erchak et al. | |
| 2005/0051785 A1 | 3/2005 | Erchak et al. | |
| 2005/0051787 A1 | 3/2005 | Erchak et al. | |
| 2005/0082543 A1 | 4/2005 | Alizadeh et al. | |
| 2005/0082545 A1 | 4/2005 | Wierer, Jr. et al. | |
| 2005/0087754 A1 | 4/2005 | Erchak | |
| 2005/0087757 A1 | 4/2005 | Erchak et al. | |
| 2005/0127375 A1 | 6/2005 | Erchak et al. | |
| 2005/0145877 A1 | 7/2005 | Erchak | |
| 2005/0173714 A1 | 8/2005 | Lee et al. | |
| 2005/0173717 A1 | 8/2005 | Lee et al. | |
| 2006/0223211 A1* | 10/2006 | Mishra et al. | 438/41 |

FOREIGN PATENT DOCUMENTS

| | | |
|---|---|---|
| EP | 1 071 143 A1 | 1/2001 |
| EP | 1 385 215 A2 | 1/2004 |
| JP | 07176788 | 7/1995 |
| JP | 2003234502 | 8/2003 |
| WO | WO 03/023857 A2 | 3/2003 |
| WO | WO 2004/004927 A2 | 1/2004 |
| WO | WO 2004/032193 A2 | 4/2004 |
| WO | WO 2004/034025 A2 | 4/2004 |
| WO | WO 2004/038767 A2 | 5/2004 |
| WO | 2004087564 A | 10/2004 |
| WO | 2006060599 A2 | 6/2006 |

OTHER PUBLICATIONS

JP Pub. 2003-234502 "Forming Method for Semiconductor and Semiconductor Device", Aug. 22, 2003, Masayuki et al., Machine English Translation.*

M. Fujita et al., "Organic light-emitting diode with ITO/organic photonic crystal," Electronics Letters, Nov. 27, 2003, vol. 39, No. 24, 2 pages.

T.N. Oder et al., "III-nitride blue and ultraviolet photonic crystal light emitting diodes," Applied Physics Letter, vol. 84, No. 4, Jan. 26, 2004, pp. 466-468.

Hiroyuki Ichikawa et al., "Efficiency enhancement in a light-emitting diode with a two-dimensional surface grating photonic cyrstal," Applied Physics Letters, vol. 84, No. 4, Jan. 26, 2004, pp. 457-459.

J. Ristic et al., "Characterization of GaN quantum discs embedded in AlxGa1-xN nanocolums grown by molecular beam epitaxy," Physical Review B68, (2003), The American Physical Society, pp. 125305-1 to 125305-5.

J.Noborisaka et al., "Catalyst-free growth of GaAs nanowires by selective-area metalorganic vapor-phase epitaxy," Applied Physics Letters 86, (2005), American Institute of Physics, pp. 213102-1 to 213103-3.

T. Hamano et al. "New Technique for Fabrication of Two-Dimensional Photonic Bandgap Crystals by Selective Epitaxy," Jpn. J. Appl. Phys. vol. 36 (1997), pp. L286 to L288.

S. Haffouz et al., "Effect of Magnesium and Silicon on the lateral overgrowth of GaN patterned substrates by Metal Organic Vapor Phase Epitaxy," MRS Internet J. Nitride Semicond. Res. 3, 8 (1998), 1998-1999 The Materials Reseach Society, pp. 1 to 6.

G. Kipshidze et al., "Controlled growth of GaN nanowires by pulsed metaloganic chemical vapor deposition," Applied Physics Letters 86, (2005) American Institute of Physics, pp. 033104-1 to 033104-3.

Kwa-Mok Kim et al., "Growth and characterization of single-crystal GaN nanorods by hydride vapor phase epitaxy," Applied Physics Letters, vol. 81, No. 12, Sep. 16, 2002, pp. 2193 ton 2195.

S. Han et al, "Controlled growth of gallium nitride single-crystal nanowires using a chemical vapor deposition method," J. Mater. Res., vol. 18, No. 2, Feb. 2003, Materials Reseach Society, pp. 245 to 249.

Hwa-Mok Kim, et al., "Nanoscale Ultraviolet-Light-Emitting Diodes Using Wide-Bandgap Gallium Nitride Nanorods," Adv. Mater.2003, 15, No. 7-8, Apr. 17, Wiley-VCH Verlag GmbH & Co. KGaA, Weinheim, pp. 567 to 569.

T. Kuykendall et al., "Metaloganic Chemical Vapor Deposition Route to GaN Nanowires with Triangular Cross Sections," Nano Letters, 2003, vol. 3, No. 8, American Chemical Society, pp. 1063 to 1066.

Hwa-Mok Kim, et al., High-Brightness Light Emitting Diodes Using Dislocation-Free Indium Gallium Nitride/Gallium Nitride Multiquantum-Well Nanorod Arrays, Nano Letters 2004, vol. 4, No. 6, American Chemical Society, pp. 1059 to 1062.

J. Su et al., "Catalytic growth of group III-nitride nanowires and nanostructures by metalorganic chemical vapor deposition," Applied Physics Letters 86, (2005), American Institute of Physics, pp. 013105-1 to 013105-3.

W. D. Zhou et al, "Electrically injected single-defect photonic bandgap surface-emitting laser at room temperature," Electronic Letters, Aug. 31, 2000, vol. 36, No. 18, pp. 1541 to 1542.

P. Bhattacharya et al., "Electrically Injected Photonic Bandgap Microcavity Light Sources," LEOS 2001 14th. Annual Meeting of the IEEE Lasers & Electro-Optics Society, San Diego, Ca, Nov. 11-15, vol. 1 of 2, pp. 76 to 77.

S. Kitamura et al, Fabrication of GaN Hexagonal Pyramids on Dot-Patterned GaN/Sapphire Substrates via Selective Metalorganic Vapor Phase Epitaxy, Jpn. J. Appl. Phys., vol. 34 (1995), Part 2, No. 9B, Sep. 15, 1995, pp. L1184 to L1186.

M. Nagahara et al., "Selective Growth of Cubic GaN in Small Areas on Patterned GaAs (100) Substrates by Metalorganic Vapor Phase Epitaxy," Jpn. J. Appl. Phys., vol. 33 (1994), Part 1, No. 1B, Jan. 1994, pp. 694 to 697.

Tredicucci et al., "Single-mode surface-plasmon laser," Applied Physics Letters, vol. 76, No. 16, Apr. 17, 2000, pp. 2164-2166.

Imada et al., "Coherent two-dimensional lasing action in surface-emitting laser with triangular-lattice photonic cyrstal structure," Applied Physics Letters, vol. 75, No. 3, Jul. 19, 1999, pp. 316-318.

Pottage et al., "Vertical-cavity surface-emitting resonances in photonic crystal films," J. Opt. Soc. Am. A, vol. 18, No. 2, Feb. 2001, pp. 442-447.

Tiwari, S., "Compound Semiconductor Device Physics," Academic Press, Inc., San Diego, CA, 1992, pp. 182-186.

G.B. Stringfellow and M. George Crawford, eds., "High Brightness Light Emitting Diodes," Academic Press, Inc., 1997, Chapter5, "AIGaInP Light-Emitting Diodes," by F.A. Kish and R.M. Fletcher, pp. 149-170.

P.A. Kohl, "Photoelectrochemical etching of semiconductors", IBM J. Res. Develop., vol. 42, No. 5, Sep. 5, 1998, pp. 629-637.

Chen-Fu Chu et al., "Comparison of p-Side Down and p-Side Up GaN Light-Emitting Diodes Fabricated by Laser Lift-Off", Jpn. J. Appl. Phys., vol. 42 (2003), Part 2, No. 2B, Feb. 15, 2003, pp. L147-L150.

W.S. Wong et al., "InxGa1-xN light emitting diodes on Si substrates fabricated by Pd-In metal bonding and laser lift-off", Applied Physics Letters, vol. 77, No. 18, Oct. 30, 2000, pp. 2822-2824.

H. Benisty et al., "Impact of Planar Microcavity Effects on Light Extraction—Part I: Basic Concepts and Analytical Trends", IEEE Journal of Quantum Electronics, vol. 34, No. 9, Sep. 1998, pp. 1612-1631.

T. Fujii et al., "Increase in the extraction efficiency of GaN-based light-emitting diodes via surface roughening", Applied Physics Letters, vol. 84, No. 6, Feb. 9, 2004, pp. 855-857.

J.J. Wierer et al., "InGaN/GaN quantum-well heterostructure light-emitting diodes employing photonic crystal structures," Applied Physics Letters, vol. 84, No. 19, May 10, 2004, pp. 3885-3887.

U.S. Appl. No. 10/804,810, filed Mar. 19, 2004 entitled "Photonic Crystal Light Emitting Device," 28 pages.

Lee et al., "Modified spontaneous emission from a two-dimensional photonic bandgap crystal slab," J. Opt. Soc. Am. B, vol. 17, No. 8, Aug. 2000, pp. 1438-1442.

Boroditsky et al., "Surface recombiantion measurements on III-V candidate materials for nanostructure light-emitting diodes," Journal of Applied Physics, vol. 87, No. 7, Apr. 1, 2000, pp. 3497-3504.

Boroditsky et al., "Light extraction from optically pumped light-emitting diode by thin-slab photonic crystals," Applied Physics Letters, vol. 75, No. 8, Aug. 23, 1999, pp. 1036-1038.

Windisch et al., "Light-emitting diodes with 31% external quantum efficiency by outcoupling of lateral waveguide modes," Applied Physics Letters, vol. 74, No. 16, Apr. 19, 1999, pp. 2256-2258.

Xu et al., "Finite-difference time-domain calculation of spontaneous emission lifetime in a microcavity," J. Opt. Soc. Am. B, vol. 16, No. 3, Mar. 1999, pp. 465-474.

Hwang et al., "Spontaneous emission rate of an electric dipole in a general microcavity," Physical Review B, vol. 60, No. 7, Aug. 15, 1999, pp. 4688-4695.

Fan et al., "High Extraction Efficiency of Spontaneous Emission from Slabs of Photonic Crystals," Physical Review Letters, vol. 78, No. 17, Apr. 28, 1997, pp. 3294-3297.

Vuckovic et al., "Surface Plasmon Enhanced Light Emitting Diode," Journal of Quantum Electronics, vol. 36, 2000, pp. 1-13.

Y.-K. Song et al., "Resonant-cavity InGaN quantum-well blue light-emitting diodes", Applied Physics Letters, vol. 77, No. 12, Sep. 18, 2000, pp. 1744-1746.

D. Pisignano et al., "Planar organic photonic crystals fabricated by soft lithography," Institute of Physics Publishing Nanotechnology 15 (2004) pp. 766-770.

U.S. Appl. No. 10/911,468, filed Aug. 4, 2004 entitled "Photonic Crystal Light Emitting Device with Multiple Lattices," 27 pages.

European Search Report, 3 pages.

"INGAN/GAN Multiple Quantum Disk Nanocolumn Light-Emitting Diodes Grown on (III) SI Substrate" Kikuchi et al, Japanese Journal of Applied Physics, Tokyo, JP vol. 43, No. 12A (Nov. 5, 2004).

"Coherent Two-Dimensional Lasing Action in Surface-Emitting Laser With Triangular Lattice Photonic Crystal Structure" Masahiro et al, Applied Physics Letters, AIP, American Institute of Physics, Melville, NY, vol. 75, No. 3, Jul. 19, 1999 P. 316-318.

* cited by examiner

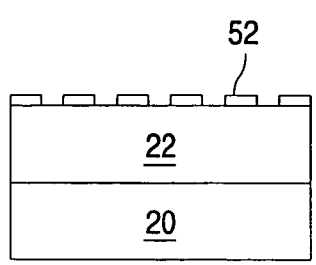
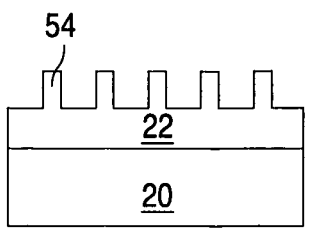
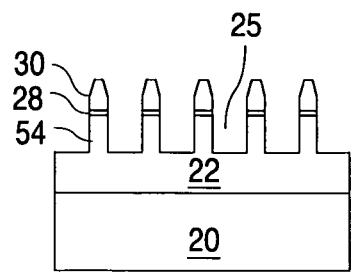
FIG. 6A     FIG. 6B     FIG. 6C
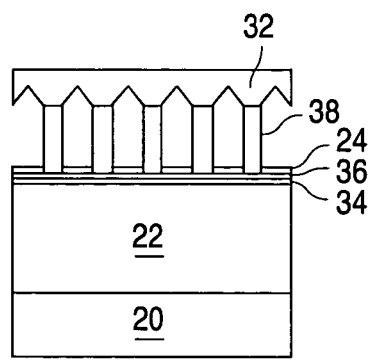
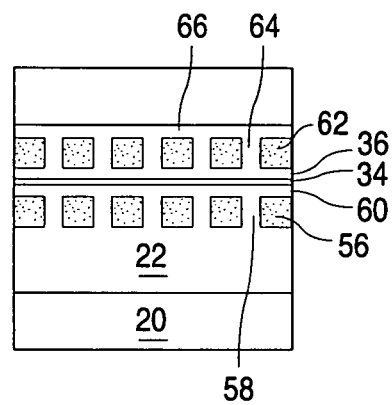
FIG. 7     FIG. 8
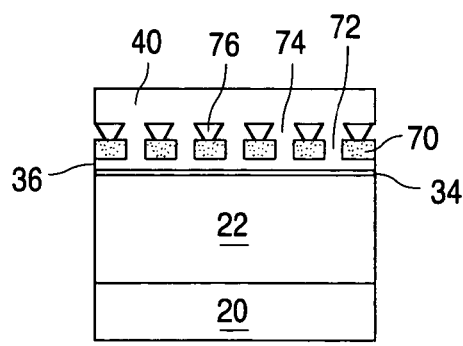
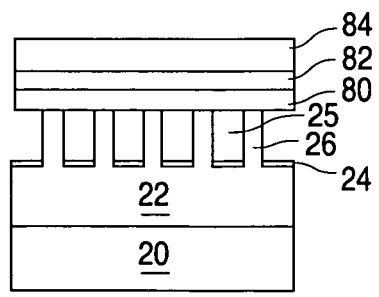
FIG. 9     FIG. 10

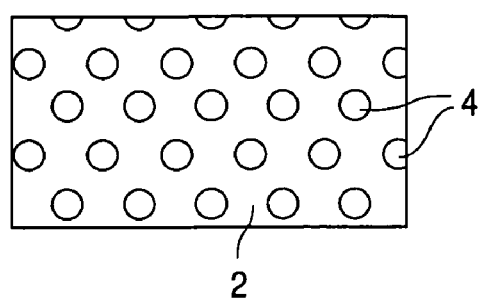
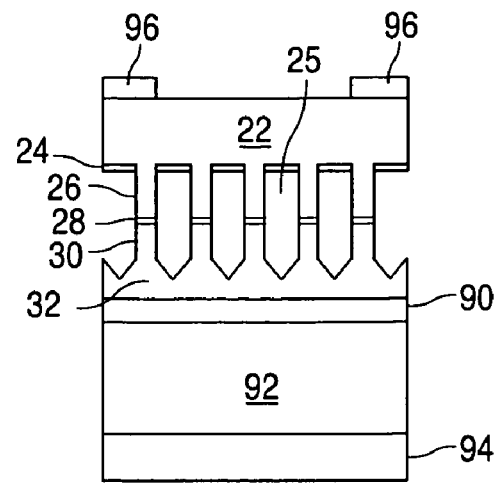
FIG. 11       FIG. 12
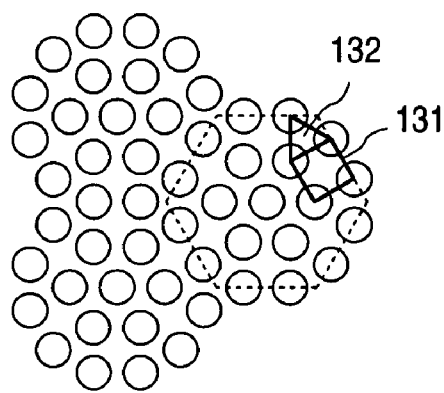
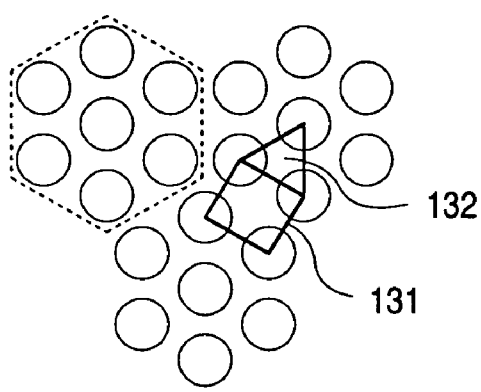
FIG. 13       FIG. 14

GROWN PHOTONIC CRYSTALS IN SEMICONDUCTOR LIGHT EMITTING DEVICES

BACKGROUND

1. Field of Invention

This invention relates to semiconductor light emitting devices including photonic crystal structures.

2. Description of Related Art

Light emitting devices such as light emitting diodes ("LEDs") are technologically and economically advantageous solid state light sources. LEDs are capable of reliably providing light with high brightness, hence in the past decades they have come to play a critical role in numerous applications, including flat-panel displays, traffic lights, and optical communications. An LED includes a forward biased p-n junction. When driven by a current, electrons and holes are injected into the junction region, where they recombine and release their energy by emitting photons. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials.

The quality of an LED can be characterized, for example, by its extraction efficiency, which measures the ratio of photons extracted from the device to photons generated in the light emitting region. The extraction efficiency is limited, for example, by the emitted photons suffering multiple total internal reflections at the walls of the high refractive index semiconductor crystal that forms the p-type, n-type, and light emitting regions of the device. As a result, many of the emitted photons do not escape into free space, leading to poor extraction efficiencies, typically less than 30%.

Various approaches have been proposed to enhance the extraction efficiency of LEDs. The extraction efficiency can be increased, for example, by enlarging the spatial angle in which the emitted photons can escape by developing suitable geometries, including cubic, cylindrical, pyramidal, and dome like shapes. However, none of these geometries can entirely eliminate losses from total internal reflection.

A further source of loss is the reflection caused by the refractive index mismatch between the LED and the surrounding media. While such losses could be reduced with an anti-reflection coating, complete cancellation of reflection can be achieved only at a specific photon energy and one angle of incidence.

U.S. Pat. No. 5,955,749, entitled "Light Emitting Device Utilizing a Periodic Dielectric Structure," granted to J. Joannopoulos et al., describes an approach to the problem of enhancing the extraction efficiency. According to U.S. Pat. No. 5,955,749, a photonic crystal is created by forming a lattice of holes completely through the semiconductor layers of the light emitting diode. The lattice of holes creates a medium with a periodically modulated dielectric constant, affecting the way light propagates through the medium. The photons of the light emitting diode can be characterized by their spectrum or dispersion relation, describing the relation between the energy and the wavelength of the photons. The relationship may be plotted, yielding a photonic band diagram consisting of energy bands, or photonic bands, separated by band gaps. Though the photonic band diagram is analogous to the spectrum of electrons in crystalline lattices as expressed in an electronic band diagram, the photonic band diagram is unrelated to the electronic band diagram. When a photonic crystal is formed in an LED it affects how light propagates in the structure. Therefore if the proper lattice spacing is chosen, light that would otherwise have been trapped in the structure by total internal reflection can now escape, increasing the extraction of the LED. Also, alternative lattices can reduce the photon mode volume in the LED structure increasing the radiative rate or internal efficiency of the LED active layer.

U.S. Pat. No. 5,955,749 does not teach how to form a complete, functional light emitting device, and proposes forming photonic crystal light emitting devices in GaAs-based crystals. Needed in the art are designs for III-nitride photonic crystal light emitting devices and methods of making such devices.

SUMMARY

In accordance with embodiments of the invention, a photonic crystal is grown within a semiconductor structure, such as a III-nitride structure, which includes a light emitting region disposed between an n-type region and a p-type region. The photonic crystal may be multiple regions of semiconductor material separated by a material having a different refractive index than the semiconductor material. For example, the photonic crystal may be posts of semiconductor material grown in the structure and separated by air gaps or regions of masking material. Growing the photonic crystal, rather than etching a photonic crystal into an already-grown semiconductor layer, avoids damage caused by etching which may reduce efficiency, and provides uninterrupted, planar surfaces on which to form electric contacts.

BRIEF DESCRIPTION OF THE DRAWINGS

FIGS. 6A-6C illustrate an alternative method of forming the devices illustrated in FIGS. 2-4.

FIG. 7 is a cross sectional view of a device with an uninterrupted, planar active region and a photonic crystal formed after the active region.

FIG. 8 is a cross sectional view of a device with two photonic crystals separated by an uninterrupted, planar active region.

FIG. 9 is a cross sectional view of an alternative embodiment of a device with an uninterrupted, planar active region and a photonic crystal formed after the active region.

FIG. 10 is a cross sectional view of a device with an uninterrupted, planar active region and a photonic crystal formed before the active region.

FIG. 11 is a top view of an example of a photonic crystal lattice of materials of varying index of refraction.

FIG. 12 illustrates the device of FIG. 2 processed into a thin film device.

FIGS. 13 and 14 illustrate two examples of arrangements that form a quasi-crystal.

DETAILED DESCRIPTION

Figure 1:
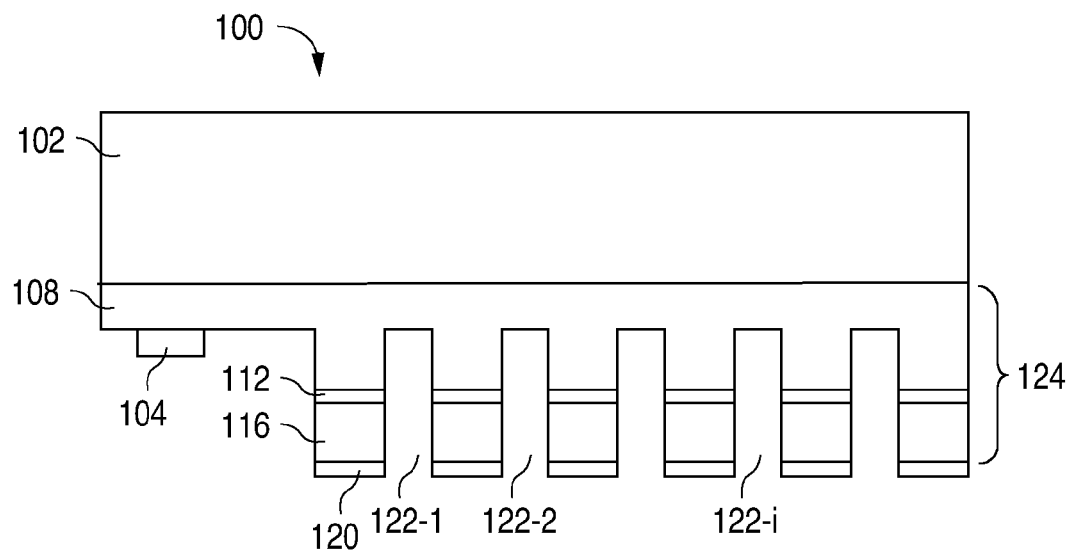
FIG. 1 is a cross sectional view of a III-nitride photonic crystal light emitting device.

FIG. 1 illustrates a III-nitride photonic crystal LED (PX-LED) 100, described in more detail in Publication No. 2003/0141507, "LED Efficiency Using Photonic Crystal Structure," filed Jan. 28, 2002 and incorporated herein by reference.

In PXLED 100 of FIG. 1, an n-type region 108 is formed over growth substrate 102 which may be, for example, sapphire, SiC, or GaN; an active region 112 is formed over n-type region 108; and a p-type region 116 is formed over active region 112. Each of regions 108, 112, and 116 may be a single layer or multiple layers of the same or different composition, thickness, or dopant concentration. A portion of p-type region 116 and active region 112 are etched away to expose a portion of n-type region 108, then a p-contact 120 is formed on p-type region 116 and an n-contact 104 is formed on the exposed portion of n-type region 108. The device may be flipped over, as illustrated in FIG. 1, and connected to a mount (not shown) through contacts 104 and 120.

Active region 112 includes a junction region where electrons from n-type region 108 combine with holes of p-type region 116 and ideally emit energy in the form of photons. Active layer 112 may include a quantum well structure to optimize the generation of photons. Many different quantum well structures have been described, for example, by G. B. Stringfellow and M. George Craford in "High Brightness Light Emitting Diodes," published by the Associated Press in 1997. The photonic crystal of PXLED 100 of FIG. 1 is created by forming a periodic structure of holes 122-$i$ in the LED.

In the device illustrated in FIG. 1, a conventional III-nitride structure is fabricated with the n-type region formed first on the substrate, followed by the active region and the p-type region. The photonic crystal device illustrated in FIG. 1 and the devices described in U.S. Pat. No. 5,955,749 may have several disadvantages. For example, the photonic crystal structure in the device of FIG. 1 may be formed by dry etching into the p-type region to form an array of holes that form a periodic structure. Dry etching may be reactive ion, inductively coupled plasma, focused ion beam, sputter, electron cyclotron resonance, or chemically assisted ion beam etching. Dry etching of p-type material is problematic because etching can damage the crystal, causing nitrogen vacancies which create n-type donors. In p-type region 116, the presence of n-type donors lowers the concentration of holes and, in cases of severe damage to the crystal, can change the conductivity type of region 116 to n-type. The inventors have discovered that the damage caused by dry etching is not limited to a localized area around the etched region, and may propagate vertically and laterally through the non-etched areas of the crystal, possibly eliminating the p-n junction and rendering the device electrically non-operational. The devices described in U.S. Pat. No. 5,955,749 also etch through p-type material, and therefore may suffer from the same widespread damage observed by the inventors. Also, though modeling has demonstrated that it is desirable to form the photonic crystal very close to or through the active region as in FIG. 1, etching through quantum wells in the active region creates surface recombination, potentially lowering the efficiency of the device.

In accordance with embodiments of the invention, a photonic crystal is grown in a semiconductor light emitting device, rather than etched. FIG. 11 is a top view of an example of a photonic crystal. A region 2 is interrupted by regions 4 of a material of different index of refraction. For example, the photonic crystal of FIG. 11 may be an array of semiconductor posts 4 of grown semiconductor material, rather than an array of holes etched into semiconductor material as described above, surrounded by an air region 2. Alternatively, region 2 may be a semiconductor region grown with holes 4.

The photonic crystal structure can include a periodic variation of the thickness of one of the semiconductor, regions, with alternating maxima and minima. An example is a grating (one-dimensional lattice) or planar lattice of posts of semiconductor material, as described above (two-dimensional lattice). The lattice is characterized by the diameter of the posts, d, the lattice constant a, which measures the distance between the centers of nearest neighbor posts, the height of the posts w, and the dielectric constant of the dielectric, disposed around the posts, $\in_h$. Parameters a, d, w, and $\in_h$ influence the density of states of the bands, and in particular, the density of states at the band edges of the photonic crystal's spectrum. Parameters a, d, w, and $\in_h$ thus influence the radiation pattern emitted by the device, and can be selected to enhance the extraction efficiency from the device. Alternatively, when the proper photonic crystal parameters are chosen, the radiation pattern of the emitted light can be narrowed, increasing the radiance of the LED. This is useful in applications where light at only specific angles is useful. In one embodiment, the photonic crystal parameters are chosen such that greater than 50% of radiation exiting the device is emitted in an exit cone defined by an angle of 45 degrees to an axis normal to a surface of the device.

The posts can be arranged to form triangular, square, hexagonal, honeycomb, or other well-known two-dimensional lattice types. Multiple lattice types may be included in the same region of the device or be used to create a quasi-crystal, which may provide greater control over light propagation from the device. FIGS. 13 and 14 illustrate two examples of an arrangement of holes that form a quasi-crystal. As illustrated in FIGS. 13 and 14, a quasi-crystal is a pattern of holes located on the vertices of a repeating pattern of squares 131 and triangles 132. Such a repeating pattern is often referred to as an Archimedean lattice or a penrose tile. The lattice constant a of a quasi-crystal is the length of a side of a triangle or square in the repeating pattern.

In some embodiments, different lattice types are formed in different regions of the device. For example, one photonic crystal structure designed to optimize total radiative power (radiative efficiency) may be formed in one region of the device, and another photonic crystal structure designed to optimize light extraction (extraction efficiency) may be formed in another region of the device.

The posts often have hexagonal cross sections, though other cross sections are possible. In some embodiments, the lattice spacing a is between about 0.1λ and about 10λ, more preferably between about 0.1λ and about 5λ, more preferably between about 0.1λ and about 3λ, and more preferably between about 0.1λ and about λ, where λ is the wavelength in the device of light emitted by the active region. In some embodiments, the lattice constant a is selected to be in or near the bandgap of the photonic crystal. For example, in a triangular lattice of holes formed in a GaN layer and filled with air, a lattice constant ranging from 0.35λ to 0.55λ is in the bandgap favoring extraction at the lower end of the range and at the bandedge favoring internal efficiency at the higher end of the range. The lattice constant range 0.35λ to 0.55λ assumes a post radius of 0.36 a. In some embodiments, the posts may have a diameter d between about 0.1 a and about 0.5 a, where a is the lattice constant. The posts can be surrounded with air or with an optional dielectric of dielectric constant $\in_h$, often between about 1 and about 16. Possible dielectrics include silicon oxides, which may be the mask layers described in the below examples. In some embodiments, the height of the posts w is at least 0.25λ. The height of the posts is limited by the preference for forming electrical contacts on planar layers without posts, thus the posts cannot extend the entire height of the device. In embodiments where the light emitting region is a planar layer uninterrupted by the photonic crystal and the photonic crystal is located above or below the light emitting region, the photonic crystal preferably extends to within 3λ of the light emitting region.

Figure 2:
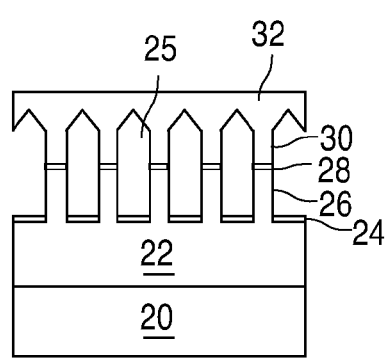
FIG. 2 is a cross sectional view of a device with the light emitting region formed within semiconductor posts that form a photonic crystal. An uninterrupted, planar p-type region is grown over the semiconductor posts.

In some embodiments of the invention, the light emitting region is included in the posts of grown semiconductor material that form the photonic crystal. FIGS. 2-5 and 6A-6C illustrate examples of such devices. In the device of FIG. 2, an n-type region 22 is conventionally grown over any suitable substrate 20 such as, for example, sapphire, SiC, or GaN. N-type region 22 often includes multiple layers of different thickness, composition, and dopant concentration, such as, for example, optional preparation layers such as buffer layers or nucleation layers designed to provide a high quality template on which n-type device layers such as an n-type cladding layer and an n-type contact layer are grown. N-type region 22 may include layers that are not intentionally doped. In embodiments where growth substrate 20 is removed, n-type region 22 may include layers which facilitate release of growth substrate 20 or facilitate thinning of the epitaxial layers after growth substrate 20 is removed.

Over the planar n-type region 22, a mask layer 24 such as SiO$_2$ is formed. Mask layer 24 may be a thin layer, for example, with a thickness less than 200 nm. Openings are formed in mask 24. Posts of semiconductor material which will form the photonic crystal are grown in the openings. Posts 26 of n-type material are grown first, followed by posts 28 of light emitting region material. In the examples described herein, the light emitting region may be any suitable light emitting region structure including, for example, a single thick light emitting layer, a single thin quantum well, multiple thin quantum wells separated by barrier layers, and multiple thick light emitting layers separated by barrier layers. After the light emitting region 28, posts 30 of p-type material are grown. The size, height, spacing, and organization of the posts may be selected to form a photonic crystal, as described above.

The semiconductor posts may be formed by, for example, low-pressure metalorganic chemical vapor deposition as described by Kipshidze et al., "Controlled growth of GaN nanowires by pulsed metalorganic chemical vapor deposition," Applied Physics Letters 86, 033104 (2005) which is incorporated herein by reference. Growth may be carried out at low pressure, for example 30 Torr, using group III precursors such as trimethylgallium and group V precursors such as ammonia, with N$_2$ as a carrier gas. Growth is nucleated by islands of a metal catalyst such as nickel formed 2-5 nm thick in the openings in mask 24. The nickel becomes supersaturated with Ga and active nitrogen supplied from the gas phase. Once nucleated, growth of the semiconductor post occurs at the solid-liquid interface between the semiconductor and the nickel. Growth may be pulsed to avoid gas phase reactions between the growth gases, such that a pulse of group V precursor is introduced to the reactor for a given time, followed by a delay, followed by a pulse of group III precursor. The resulting posts grow perpendicular to the substrate surface, with constant diameters and smooth sidewalls.

Alternatively, the posts can be grown as described by S. Hoffouz et al., "Effect of Magnesium and Silicon on the lateral overgrowth of GaN patterned substrates by Metal Organic Vapor Phase Epitaxy," MRS Internet J. Nitride Semicond. Res. 3, 8 (1998) which is incorporated herein by reference. Hoffuz describes patterning the growth substrate surface with micron sized openings in a growth mask. The mask prevents growth on top of the mask. Growth starts in the mask openings and can proceed in a lateral overgrowth mode up and over the mask, or can grow preferentially vertical depending on the type and concentration of dopant that is flowed in during growth. For example if columnar growth is desired then high SiH$_4$ flow is used during growth. If lateral overgrowth is desired then low flow of SiH$_4$ or Cp$_2$Mg is used.

After p-type posts 30 are grown, the growth conditions are changed such that inverted pyramids are formed over the posts, which pyramids eventually connect to form a planar layer 32 over the posts and spaces 25 between the posts. If used, the metal catalyst is removed prior to growth of planar layer 32. Hoffouz et al., incorporated above, describes lateral overgrowth techniques for p-type Mg-doped III-nitride materials. P-type posts 30 and planar p-type region 32 may include multiple layers of different thickness, composition, and dopant concentration, such as, for example, a p-type cladding layer and a p-type contact layer.

After growth of planar p-type region 32, one or more metal layers which form a p-contact (not shown) are deposited on p-type region 32. The p-contact may include multiple layers such as an ohmic contact layer, a reflective layer, and a guard metal layer. The reflective layer is often silver or aluminum. The guard metal may include, for example, nickel, titanium, or tungsten. The guard metal may be chosen to prevent the reflective metal layer from migrating, particularly in the case of a silver reflective layer, and to provide an adhesion layer for a bonding layer used to bond the semiconductor structure to a host substrate.

The semiconductor structure may then be metal bonded to a host substrate and processed into a thin film device, as illustrated in FIG. 12. One or more bonding layers 90, typically metal, may serve as compliant materials for thermocompression or eutectic bonding between the semiconductor structure and host substrate 92. Examples of suitable bonding layer metals include gold and silver. Host substrate 92 provides mechanical support to the semiconductor layers after the growth substrate is removed, and provides electrical contact to the p-type region through metal layers 90. The host substrate is selected to be electrically conductive (i.e. less than about 0.1 Ωcm), to be thermally conductive, to have a coefficient of thermal expansion matched to that of the semiconductor layers, and to be flat (i.e. with an root mean square roughness less than about 10 nm) enough to form a strong bond. Suitable materials include, for example, metals such as Cu, Mo, Cu/Mo, and Cu/W; semiconductors with metal contacts 94, such as Si with ohmic contacts and GaAs with ohmic contacts including, for example, one or more of Pd, Ge, Ti, Au, Ni, Ag; and ceramics such as compressed diamond and AlN.

The host substrate and semiconductor structure are pressed together at elevated temperature and pressure to form a durable metal bond between the bonding layers. In some embodiments, bonding is done on a wafer scale, before a wafer with a semiconductor structure is diced into individual devices. Alternatively, bonding is done on a die scale after a wafer with the semiconductor structure is diced into individual devices. The temperature and pressure ranges for bonding are limited on the lower end by the strength of the resulting bond, and on the higher end by the stability of the host substrate and the semiconductor structure. For example, high temperatures and/or high pressures can cause decomposition of the epitaxial layers in the semiconductor structure, delamination of the p-contact, failure of diffusion barriers, for example in the p-contact, or outgassing of the component materials in the semiconductor layers. A suitable temperature range is, for example, about 200° C. to about 500° C. A suitable pressure range is, for example, about 100 psi to about 300 psi.

After bonding to the host substrate, growth substrate 20 may be removed by a technique appropriate to the growth substrate material. A sapphire growth substrate may be removed by, for example, laser melting. Other removal techniques include etching and lapping. Once the growth substrate is removed, n-type region 22 may be thinned to a desired thickness or to remove low quality preparation layers adjacent to growth substrate 20. An n-contact 96 may then be formed on the exposed surface of n-type region 22. Since the p-contact is reflective, light is extracted from the device through the exposed surface of n-type region 22.

Alternatively, the device of FIG. 2 may be processed into a flip chip, where growth substrate 20 remains on the device and light is extracted from the device through the growth substrate. A portion of p-type regions 30 and 32 and light emitting region 28 are removed to expose a part of one of n-type regions 22 or 24. An n-contact is formed on the exposed part of one of the n-type regions and a p-contact is formed on the remaining portion of p-type region 32. The die is flip-chip connected to a carrier and light is extracted from the device through substrate 20. To further improve light extraction substrate 20 may be removed by underfilling the die for mechanical support of the semiconductor structure, then removing the substrate by, for example, laser lift-off, etching, or lapping.

Figure 3:
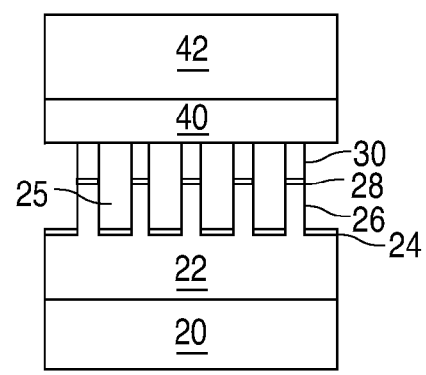
FIG. 3 is a cross sectional view of a device with the light emitting region formed within semiconductor posts that form a photonic crystal. The semiconductor posts are bonded to a second semiconductor structure formed on a second growth substrate.

FIG. 3 illustrates another example of a device where the light emitting region is included in the posts of grown semiconductor material that form the photonic crystal. N-type region 22, n-type posts 26, light emitting region posts 28, and p-type posts 30 are grown as described above in reference to FIG. 2. Rather than growing a planar p-type region 32 over the posts, growth is stopped after growth of the posts and the structure is bonded to a semiconductor region 40 grown on a second growth substrate 42. Semiconductor region 40 may be, for example, a p-type region.

The top surface of the semiconductor posts and the surface of semiconductor region 40 are bonded together under elevated temperature and pressure. An appropriate temperature for bonding may be, for example, between 700 and 1200° C.; an appropriate pressure for bonding may be, for example, between 5 and 1500 psi. The surfaces may be pressed together at the above temperature and pressure in an atmosphere of, for example, $N_2$ or $NH_3$ for a specified time period, for example, at least 2 minutes, often for at least 30 minutes. Under these conditions, a robust semiconductor bond is formed between the two surfaces. Such a bond may withstand the temperatures necessary for further semiconductor processing subsequent to bonding, such as growing additional semiconductor layers. Other bonding techniques besides semiconductor wafer bonding may be used, such as diffusion soldering bonding. In a diffusion soldering bond, one or more metals such as Zn and Sn are deposited at the bonded interface and bonded at low temperature. The ZnSn bond is stable at high temperatures, for example temperatures greater than 900° C. In another alternative method, the surfaces are bonded using a thin metallic film such as Al as a bonding layer. The Al may alloy into the two semiconductor surfaces, creating a bond that is stable at high temperatures.

After bonding, one of growth substrate 20 and growth substrate 42 may be removed, exposing a semiconductor surface. Contacts may be more readily formed on the uninterrupted, planar surface exposed by removal of either substrate than on the tops of p-type posts 30. After growth substrate 42 is removed, the resulting device may be processed into a thin film device or a flip chip, both described above in reference to FIG. 2.

Figure 4:
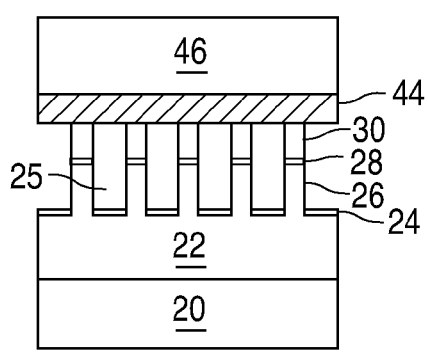
FIG. 4 is a cross sectional view of a device with the light emitting region formed within semiconductor posts that form a photonic crystal. The semiconductor posts are metal bonded to a host substrate.

The device of FIG. 4 is like the device of FIG. 3 except that the semiconductor posts are metal bonded 44 to a host substrate 46, as described above in reference to FIG. 2. Growth substrate 20 may be removed, as described above in reference to FIG. 2.

Figure 5:
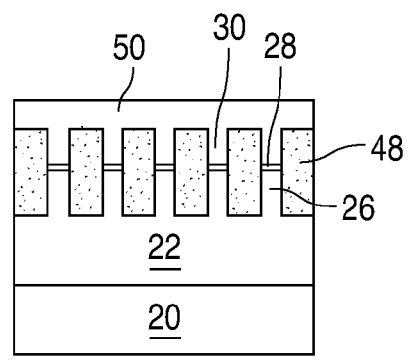
FIG. 5 is a cross sectional view of a device with the light emitting region formed within semiconductor posts that form a photonic crystal, where the semiconductor posts are grown through thick mask layers.

In each of the devices illustrated in FIGS. 2, 3, and 4, the semiconductor posts that form the photonic crystal are grown through openings in a thin mask layer 24. In the device illustrated in FIG. 5, the semiconductor posts are grown through openings in a thick mask layer 48. Mask 48 may be $SiO_2$ with a thickness greater than $0.25\lambda$. The openings in mask 48 may be arranged such that the semiconductor material grown in the openings forms an array of posts. Alternatively, mask 48 may be formed such that the mask forms the array of posts, and the semiconductor material fills in the areas between the mask material posts. The mask confines growth to the area between the masked regions, thus special growth techniques are not necessary, except higher pressure during growth, for example, greater than 100 Torr may be necessary to force the precursor gases into the openings in mask 48. Once the semiconductor posts reach the top of mask 48, p-type region 50 grows in an uninterrupted, planar sheet. Mask 48 may be left in the gaps between the semiconductor posts, as illustrated in FIG. 5, or removed prior to growth of planar p-type region 50, to create air gaps between the semiconductor posts.

FIGS. 6A-6C illustrate an alternative method of growing the devices illustrated in FIGS. 2-4, where the semiconductor posts are grown on a template formed by dry etching. As illustrated in FIG. 6A, a planar n-type region 22 is grown over substrate 20. A mask layer 52 is formed over n-type region 22, then a portion of n-type region 22 is etched away to form n-type posts 54. Mask 52 is removed, and growth is resumed. The growth conditions are selected such that nucleation does not occur in the areas between posts 54, and growth continues only on posts 54. For example, growth at low pressure, for example less than 100 Torr, or growth at high n-type dopant precursor flow may confine growth to the tops of posts 54. Light emitting region posts 28 are grown, followed by p-type region posts 30, as described above. The device may be finished by growing an uninterrupted, planar p-type region as illustrated in FIG. 2, bonding the semiconductor posts to a semiconductor region as illustrated in FIG. 3, or metal bonding the semiconductor posts to a host substrate as illustrated in FIG. 4.

In the embodiments illustrated in FIGS. 2-5 and 6A-6C, light emitting region 28 is located within the semiconductor posts that form the photonic crystal. Growth of the semiconductor posts permits the photonic crystal to be formed at a depth which is difficult to achieve by masking and etching. In addition, growing the semiconductor posts avoids the damage and high surface recombination caused by formation of the photonic crystal by dry etching. Such damage is particularly problematic for the light emitting region.

In some embodiments of the invention, the light emitting region is a planar layer uninterrupted by the photonic crystal, and formed before and/or after the posts of grown semiconductor material that form the photonic crystal. FIGS. 7-10 illustrate examples of such devices. In the device illustrated in FIG. 7, an n-type region 22 is grown over a substrate 20, as described above. An uninterrupted, planar light emitting region 34 is grown over n-type region 22, followed by a thin p-type region 36. For example, as described above, p-type region 36 may have a thickness less than 3λ. As the thickness between the photonic crystal and the light emitting region is reduced, device performance is expected to improve, thus p-type region 36 is grown as thin as possible. A thin mask layer with openings is then formed over p-type region 36, similar to the mask formed on n-type region 22 as described above in reference to FIG. 2. P-type semiconductor posts, which form the photonic crystal, are grown through the openings in mask 24. After growth of p-type posts 38, either a planar p-type region 32 may be grown over the posts, as illustrated in FIG. 7, or a semiconductor region may be bonded to posts 38 as illustrated in FIG. 3, or a host substrate may be metal bonded to posts 38 as illustrated in FIG. 4.

Alternatively, the photonic crystal may be located below the active region, in the n-type region, as illustrated in FIG. 10. In the device illustrated in FIG. 10, a planar n-type region 22 is grown over growth substrate 20. N-type posts 26, which form the photonic crystal, are grown through openings in mask 24. Uninterrupted, planar n-type region 80, light emitting region 82, and p-type region 84 are disposed over n-type posts 26. N-type region 80, light emitting region 82, and p-type region 84 may be grown over posts 26, or they may be grown on a separate growth substrate and bonded to n-type posts 26 as described above in reference to FIG. 3.

The device illustrated in FIG. 8 includes two photonic crystals disposed on opposite sides of a planar light emitting region. A thick mask layer 56 with openings is formed over n-type region 22. Mask 56 may be, for example, at least 0.25λ thick. N-type posts 58, which form the first photonic crystal, are grown through the openings in mask 56. Growth of n-type material continues over mask 56 to form an uninterrupted, planar n-type region 60. A light emitting region 34 is grown over n-type region 60, followed by a thin p-type region 36. As described above, n-type region 60 and p-type region 36 may each have a thickness less than 3λ. A second thick mask layer 62 with openings is formed over p-type region 36, then p-type posts 64 are grown through the openings in mask 62, followed by an uninterrupted, planar p-type region 66, which grows over mask 62. In some embodiments, the gaps in the semiconductor in the two photonic crystals illustrated in FIG. 8 are aligned.

In the device illustrated in FIG. 9, the photonic crystal is formed not from posts, as described above, but from pyramids. Pyramids result when III-nitride material is grown conventionally through openings in a mask, as opposed to the growth techniques for forming posts described above in reference to FIG. 2. In the device of FIG. 9, an n-type region 22 is formed over growth substrate 20, followed by a light emitting region 34 and a thin p-type region 36. A mask layer 70 with openings is deposited over p-type region 36, then p-type material 72 is grown first in the openings in mask 70, then over the mask to form pyramids 74. Growth is stopped before gaps 76 between pyramids 74 are filled in. A semiconductor region 40, often p-type and grown on a separate growth substrate, is then bonded to pyramids 74. Either growth substrate 20 or the growth substrate on which semiconductor region 40 is grown (not shown) is removed. As an alternative to semiconductor region 40, a host substrate may be metal bonded to pyramids 74. Also, a layer that preserves the gaps 76 between pyramids 74, but ends in a planar, uninterrupted surface at the top, may be grown over pyramids 74.

Alternatively, mask 70 of FIG. 9 may be deposited over n-type region 22, such that material 72 grown in the mask openings and pyramids 74 are n-type. An uninterrupted, planar p-type region, active region, and optional n-type region may be grown on a separate growth substrate, then bonded to n-type pyramids 74.

Embodiments of the invention offer several advantages. Damage caused by etching the photonic crystal is avoided, thus devices incorporating a grown photonic crystal may offer improved efficiency over devices with an etched photonic crystal. Also, in embodiments of the invention, planar surfaces on which to make electrical contacts are available on both the p-type side and the n-type side of the active region. Contact design is thus simplified over a device that requires making contact to a layer in which a photonic crystal is formed.

Having described the invention in detail, those skilled in the art will appreciate that, given the present disclosure, modifications may be made to the invention without departing from the spirit of the inventive concept described herein. For example, the device structures in the examples illustrated above are not limited to the specific growth technique described in the example. For example, the device with two photonic crystals illustrated in FIG. 8 may be grown using thin mask layers, as illustrated in FIG. 2, rather than the thick mask layers illustrated in FIG. 8, or may be grown with the pyramids illustrated in FIG. 9, rather than the posts illustrated in FIG. 8. Therefore, it is not intended that the scope of the invention be limited to the specific embodiments illustrated and described.

What is being claimed is:

1. A method comprising forming a photonic crystal within a semiconductor structure, the semiconductor structure comprising a light emitting region configured to emit light of wavelength λ when forward biased, the light emitting region being disposed between an n-type region and a p-type region, wherein forming the photonic crystal comprises:
   forming a plurality of regions of semiconductor material having a first refractive index; and
   forming a plurality of regions of a material having a second refractive index, wherein the second refractive index is different from the first refractive index;
   wherein the regions of material having a second refractive index are disposed between the regions of semiconductor material in an array, and the material having a first refractive index is grown around the material having a second refractive index, and each region of material having a second refractive index is located less than 5λ from a nearest neighbor region of material having a second refractive index; and
   wherein the light emitting region is substantially planar and the regions of material having a second refractive index are confined to a region above or below the light emitting region.

2. The method of claim 1 wherein the semiconductor structure is a III-nitride structure.

3. The method of claim 1 wherein the material having a second refractive index is air.

4. The method of claim 1 wherein the material having a second refractive index comprises one or more of air, an oxide of silicon, a nitride of silicon, an oxy-nitride of silicon, and a dielectric.

5. The method of claim 1 wherein growing a photonic crystal comprises:
   forming on a semiconductor surface a mask having a plurality of openings; and
   growing a semiconductor material through the openings.

6. The method of claim 5 wherein the semiconductor material grown through the openings comprises a plurality of semiconductor posts.

7. The method of claim 5 wherein the semiconductor material has a thickness greater than a thickness of the mask.

8. The method of claim 5 wherein the semiconductor material has a thickness substantially the same as a thickness of the mask.

9. The method of claim 6 further comprising providing a metal catalyst in the plurality of openings prior to growing the plurality of posts of semiconductor material.

10. The method of claim 9 wherein the metal catalyst is nickel.

11. The method of claim 6 further comprising growing a semiconductor layer having a substantially planar, uninterrupted top surface over the plurality of posts.

12. The method of claim 6 wherein the semiconductor structure is a first semiconductor structure, the method further comprising bonding a second semiconductor structure to the plurality of posts.

13. The method of claim 6 further comprising bonding a host substrate to the posts by a metal bonding layer disposed between the host substrate and the plurality of posts.

14. The method of claim 5 further comprising prior to growing a plurality of posts, etching away a portion of the semiconductor surface to define a photonic crystal.

15. The method of claim 5 wherein the photonic crystal is formed in the n-type region.

16. The method of claim 5 wherein the photonic crystal is formed in the p-type region.

17. The method of claim 5 wherein the photonic crystal is a first photonic crystal formed in the n-type region, the method further comprising forming a second photonic crystal in the p-type region.

18. The method of claim 5 wherein at least one of the plurality of posts has a substantially constant diameter, substantially straight side walls, and grows perpendicular to a surface of a growth substrate.

19. The method of claim 1 wherein the regions of material having a second refractive index have a thickness of at least $\frac{1}{4}\lambda$.

20. The method of claim 1 wherein the regions of material having a second refractive index are located within $3\lambda$ of the light emitting region.

21. The method of claim 1 wherein the plurality of regions of semiconductor material and the plurality of regions of material having a second refractive index are arranged in a lattice having a lattice constant between $0.1\lambda$ and $3\lambda$.

22. The method of claim 1 wherein the plurality of regions of semiconductor material and the plurality of regions of material having a second refractive index are arranged in a lattice having a lattice constant between $0.1\lambda$ and $\lambda$.

23. The method of claim 1 wherein:
the material having a second refractive index is air; and
the plurality of regions of semiconductor material and the plurality of regions of material having a second refractive index are arranged in a lattice having a lattice constant between from $0.35\lambda$ and $0.55\lambda$.

24. The method of claim 1 wherein the plurality of regions of semiconductor material and the plurality of regions of material having a second refractive index are arranged in a linear grating.

25. The method of claim 1 wherein the plurality of regions of semiconductor material and the plurality of regions of material having a second refractive index are arranged in a lattice, at least a portion of the lattice comprising one of a triangular, honeycomb, Archimedean, and quasi-crystal lattice.

26. The method of claim 25 wherein a radius of one of the regions of semiconductor material is 0.36 multiplied by the lattice constant.

27. The method of claim 1 further comprising:
etching away a portion of the p-type region and the light emitting region to expose a portion of the n-type region;
forming electrical contacts on a remaining portion of the p-type region and the exposed portion of the n-type region; and
attaching the electrical contacts to a carrier.

28. The method of claim 27 wherein the semiconductor is grown on a growth substrate, the method further comprising:
filling a gap between the carrier and the semiconductor structure; and
removing the growth substrate.

29. The method of claim 1 wherein the semiconductor structure is grown on a growth substrate, the method further comprising:
attaching a surface of the semiconductor structure to a carrier; and
removing the growth substrate.

30. The method of claim 1 wherein the light emitting layer has a lateral extent larger than a lateral extent of one of the regions of semiconductor material having a first refractive index.

31. The method of claim 1 wherein the photonic crystal is disposed between first and second semiconductor layers, wherein each of the first semiconductor layer and the second semiconductor layer is a planar semiconductor layer that is substantially uninterrupted by the photonic crystal.

32. The method of claim 31 wherein the first semiconductor layer is an n-type layer and the second semiconductor layer is a ptype layer.

33. The method of claim 1 further comprising forming a first electrical contact on the n-type region and a second electrical contact on the p-type region, wherein the first and second electrical contacts are formed on planar semiconductor layers that are uninterrupted by the photonic crystal.

34. The method of claim 1 wherein a top surface and a bottom surface of the semiconductor structure are uninterrupted by the photonic crystal.

35. A method comprising growing a photonic crystal within a semiconductor structure, the semiconductor structure comprising a light emitting region configured to emit light of wavelength $\lambda$ when forward biased, the light emitting region being disposed between an n-type region and a p-type region, wherein growing the photonic crystal comprises:
growing a plurality of regions of semiconductor material having a first refractive index; and
growing a plurality of regions of a material having a second refractive index, wherein the second refractive index is different from the first refractive index;
wherein the regions of material having a second refractive index are disposed between the regions of semiconductor material in an array, and each region of material having a second refractive index is located less than $5\lambda$ from a nearest neighbor region of material having a second refractive index; and
wherein the light emitting region is substantially planar and the regions of material having a second refractive index are confined to a region above or below the light emitting region.

* * * * *